(12) United States Patent
Spring et al.

(10) Patent No.: US 7,200,229 B2
(45) Date of Patent: Apr. 3, 2007

(54) MODULAR COMMUNICATION PLATFORM

(75) Inventors: Richard D. Spring, Cedar Rapids, IA (US); Timothy E. Snodgrass, Palo, IA (US); Robert R. Jakoubek, Cedar Rapids, IA (US); Steve I. Lebo, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 876 days.

(21) Appl. No.: 10/229,941

(22) Filed: Aug. 28, 2002

(65) Prior Publication Data

US 2004/0052368 A1 Mar. 18, 2004

Related U.S. Application Data

(63) Continuation-in-part of application No. 10/198,493, filed on Jul. 18, 2002, now Pat. No. 6,741,466, and a continuation-in-part of application No. 10/198,361, filed on Jul. 18, 2002, and a continuation-in-part of application No. 10/197,737, filed on Jul. 18, 2002, and a continuation-in-part of application No. 10/198,522, filed on Jul. 18, 2002, now Pat. No. 6,574,117, and a continuation-in-part of application No. 10/198,500, filed on Jul. 12, 2002, now Pat. No. 6,665,189.

(51) Int. Cl.
*H04L 9/00* (2006.01)
*H04L 17/02* (2006.01)
*H04B 1/38* (2006.01)
*H04M 1/00* (2006.01)

(52) U.S. Cl. .................... 380/52; 455/575.1; 455/90.3; 455/557

(58) Field of Classification Search ................... 380/52
See application file for complete search history.

(56) References Cited

U.S. PATENT DOCUMENTS

| 5,499,295 A | * | 3/1996 | Cooper ........................ 380/270 |
| 6,041,035 A | | 3/2000 | Thedens ...................... 370/217 |
| 2002/0095594 A1 | * | 7/2002 | Dellmo et al. .............. 713/200 |

OTHER PUBLICATIONS

Co-pending U.S. Appl. No. 10/198,520, entitled "Modular Electronics System Package", filed Jul. 18, 2002, inventor S. Lebo.

(Continued)

*Primary Examiner*—Kambiz Zand
*Assistant Examiner*—Kristin D. Sandoval
(74) *Attorney, Agent, or Firm*—Nathan O. Jensen; Kyle Eppele

(57) ABSTRACT

A modular radio includes a chassis holding a network infosec unit module; a power amplifier module; and at least one transceiver module. Each of the modules include a separate housing and is removable and replaceable. The modules communicate via a bus and are reconfigurable along the bus. The transceivers support a channel that may be reprogrammable by the network interface.

20 Claims, 2 Drawing Sheets

OTHER PUBLICATIONS

Co-pending U.S. Appl. No. 10/198,493, entitled "Modular Electronics System Chassis", filed Jul. 18, 2002, inventor S. Lebo.
Co-pending U.S. Appl. No. 10/198,361, entitled "Ruggedized Electronics Sub-System Module", filed Jul. 18, 2002, inventor S. Lebo.
Co-pending U.S. Appl. No. 10/197,737, entitled "Ruggedized Electronics Module Cooling System", filed Jul. 18, 2002, inventor S. Lebo and S. Sellner.
Co-pending U.S. Appl. No. 10/198,522, entitled "Restraint Apparatus For An Electronics Module", filed Jul. 18, 2002, inventor S. Lebo.
"Sincgars, Evolution to Revolution", ITT Industries (www.acd.itt.com).
"Programmable Cryptography Emerges From Advanced Chip", Signal Magazine, Aug. 1998, pp. 1-6.

* cited by examiner

MODULAR COMMUNICATION PLATFORM

CROSS-REFERENCE TO RELATED PATENT APPLICATIONS

This application is a continuation-in-part of the following applications:

U.S. patent application Ser. No. 10/198,500, filed on Jul. 12, 2002 U.S. Pat. No. 6,665,189, entitled "MODULAR ELECTRONICS SYSTEM PACKAGE", and having inventor Steve I. Lebo;

U.S. patent application Ser. No. 10/198,493, filed on Jul. 18, 2002 U.S. Pat. No. 6,741,466, entitled "MODULAR ELECTRONICS SYSTEM CHASSIS", and having inventor Steve I. Lebo;

U.S. patent application Ser. No. 10/198,361 filed on Jul. 18, 2002, entitled "RUGGEDIZED ELECTRONICS SUBSYSTEM MODULE", and having inventor Steve I. Lebo;

U.S. patent application Ser. No. 10/197,737 filed on Jul. 18, 2002, entitled "RUGGEDIZED ELECTRONIC MODULE COOLING SYSTEM", and having inventors Steve I. Lebo and Scott J. Sellner; and U.S. patent application Ser. No. 10/198,522, filed on Jul. 18, 2002 U.S. Pat. No. 6,574,117, entitled "RESTRAINT APPARATUS FOR AN ELECTRONICS MODULE", and having inventor Steve I. Lebo.

Each of the foregoing applications is incorporated herein by reference.

BACKGROUND OF THE INVENTION

The present invention relates generally to the field of radio systems and more particularly, to a modular platform supporting different radio channels.

Traditionally, multi channel radios for use in government or the military arena included a single box housing having a circuit single board or card with all of the components being hard wired. In order to repair, upgrade or add additional channels, the entire radio needs to be transported to a repair facility. Repairs in the field are difficult due to the hard wiring of all of the radio components. Even if only one channel of a multi-channel radio is not operating properly, the entire radio must be sent in for repair. As a result the entire radio is rendered inoperative until the system is repaired or upgraded.

Alternatively a multi channel radio may include a single card with multiple channels, or multiple cards with each card having at least one channel. If the operator knows which card to pull, it is possible, to pull the specific card required and send it in for repair or replacement. However, this approach still requires the housing to be disassembled and reassembled in the field. Additionally, multiple cards having multiple channels in a single housing makes the management of heat dissipation difficult.

Traditionally, the military has used federated radio systems that have a radio for each specific application such as VHF, UHF and HF. More recently the military has been pursuing a course of software defined radios that include hardware that can be reprogrammed with wave forms via a software upload. This permits update to the radio platforms without changing hardware every time a new function is added.

It would be desirable to provide a modular multiple channel radio that was easy to repair or upgrade that minimized the need for cooling. It would also be desirable to provide a modular multiple channel radio platform that was flexible and could support anywhere from a single channel to multiple interchangeable ten or more (i.e. not limited to ten) channels. Further it would be desirable to provide a modular radio platform, where the modules may be reconfigured and/or reprogrammed to support different radio channels.

SUMMARY OF THE INVENTION

One embodiment of the invention relates to a modular communications platform including a chassis; a network interface module; a power amplifier module; and at least one transceiver module. Means for communication security encryption is located in the network interface module only. Each of the network interface module, power module and transceiver module includes an individual housing that is removably coupled to the chassis.

Another embodiment relates to a radio including a frame supporting a bus; a network interface module; a power amplifier module; and at least two transceiver modules. Each of the transceivers and power amplifier may be located at any position on the frame and reconfigured to be located at any other position.

Still a further embodiment relates to modular radio having a network interface module; at least two identical transceiver modules; and a power amplifier module; each module including a separate housing. Each transceiver can be programmed by the user through the network interface to support a particular channel.

DETAILED DESCRIPTION OF THE PREFERRED EMBODIMENTS

Figure 1:
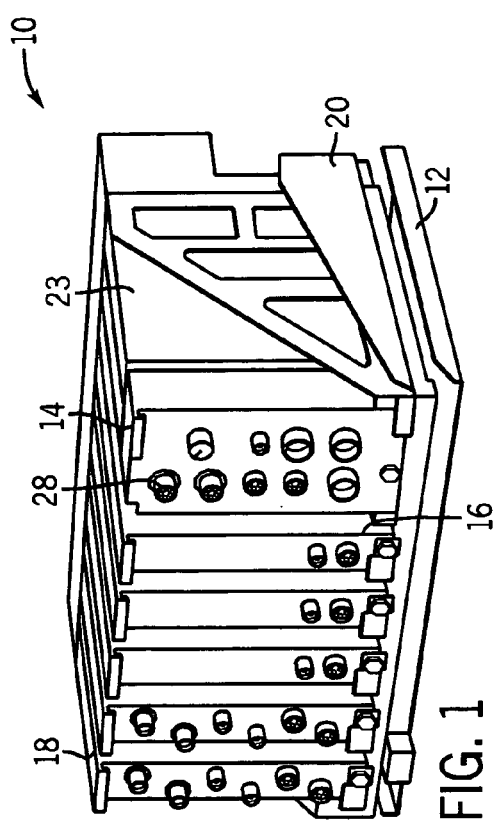
FIG. 1 is a perspective view of a three channel modular radio platform.

Referring to FIG. 1 a modular radio 10 is illustrated having a platform adapter 12 a network/platform interface module (PIM) 14, at least one transceiver module 16 and at least one power amplifier module 18. A chassis 20 including a power source and an internal bus 21 interconnects the network/platform interface 14, power amplifier module 18 and each of the transceivers 16. In an exemplary configuration, an active cooling system such as but not limited to a fan module 23 maybe coupled to platform adapter 12.

Network/Platform interface module 14 includes the circuitry and processors to perform such functions as communication security encryption (COMSEC). Network/Platform interface module 14 is programmable so it can run different algorithms that can be downloaded with software. In the exemplary embodiment all COMSEC related circuitry and associated NSA certification is confined to the Network/Platform interface module 14. This allows the other modules to be free of any COMSEC related circuitry and any other hardware or software that requires NSA certification.

The network/platform interface module 14 may be replaced as needed to permit the radio 10 to interface with different platforms. Alternatively, network/platform interface module 14 maybe configured for use with platforms and/or vehicles. For example, a tank may require an Ethernet interface, while an airplane may have an interface like Mil standard 1553. In order for the radio 10 to operate in these two different platform environments, only the network/platform interface module 14 need be exchanged. The network/platform interface module 14 includes specific input output devices as well as the physical connectors 28. Where the specific environment calls for different types of input output devices, the entire network/platform interface module 14 may simply be replaced to better suit the particular environment or platform. Network/platform interface module 14 is disposed in a separate housing that, in the preferred embodiment, is water proof. If the network/platform module 14 needs to be repaired or upgraded only that module need be sent to the repair shop or station. Similarly, a spare or upgraded module could be used to replace the damaged module or module to be upgraded without the need to send the entire radio 10 to the repair station.

In an alternative embodiment, network/platform interface module may be formed of a separate network infosec assembly having the COMSEC and NSA certified hardware and software, and a separate platform interface assembly. Where both network infosec assembly and platform interface assembly would have separate housings. The platform interface assembly includes different connections needed to operated in different environments and could either attach to the front face of the network infosec assembly or could be located in side-by-side relationship to the network infosec assembly, similar to the manner in which the transceiver modules 16 and power amplifier modules 18 are located.

Power amplifier module 18 is a separate self-contained module that is connected to the bus 21 incorporated into the platform adapter 12 for communication with transceivers 16 and network/platform interface module 14. Power amplifier module 18 is also a stand alone module enclosed in a separate water proof housing and communicates with the transceivers 16 via cables. Power amplifier module 18 includes a signal amplifier for transmitting. As illustrated in FIG. 1 it is possible to have more than one power amplifier module 18 as needed to support a given application. Each power amplifier module 18 is located in its own housing that is connected to chassis 20. To upgrade or repair power amplifier module 18, it is simply removed from the platform adapter 12 and a new power amplifier module 18 is attached. The removed module can be sent in for repair or upgrade without requiring the entire radio to be disassembled and shipped to a repair facility. In the exemplary embodiment, platform adapter 12 includes a plurality of mechanical connectors (not shown).

Figure 2:
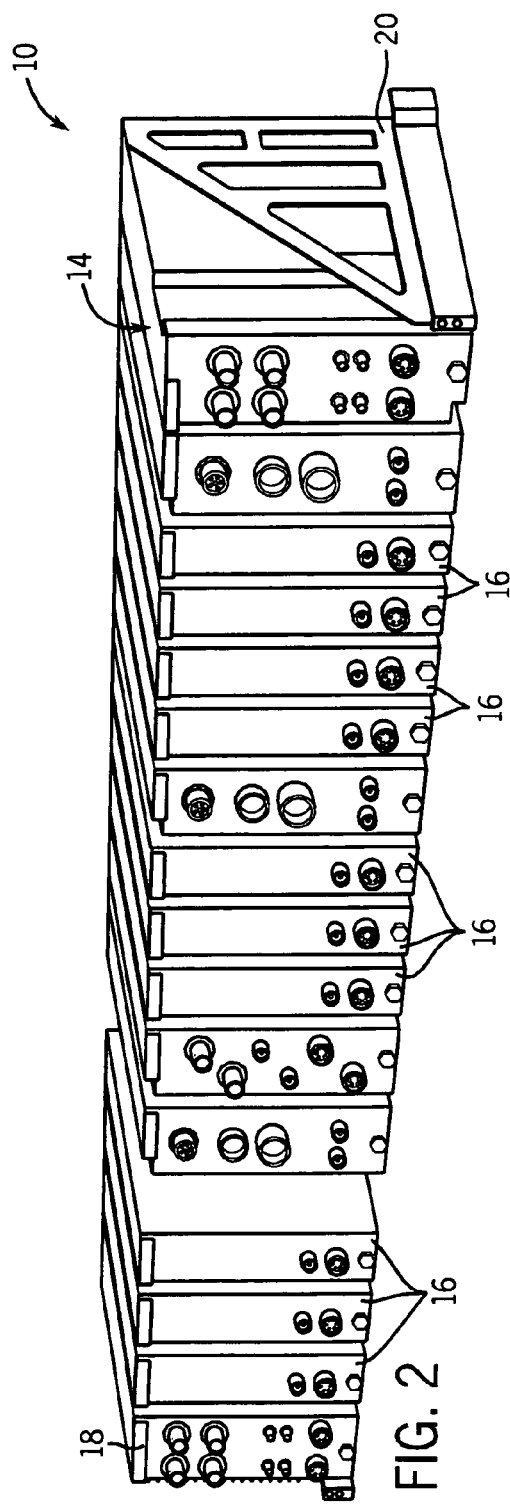
FIG. 2 is a perspective view of an extended ten channel modular radio platform.

As illustrated in FIGS. 1 and 2, the number of transceivers 16 can vary. The only limitation is the physical size of the bus and platform adapter 12 to determine how many transceivers 16 can be attached to radio 10. Each transceiver 16 can support a single half duplex channel. In one embodiment, each transceiver 16 supports a single half duplex channel. Each transceiver 16 is secured within its own housing that is removably connected to radio 10 via platform adapter 12. Each transceiver 16 can be upgraded, replaced or repaired by simply disconnecting the transceiver and replacing it with another transceiver or reconnected after it has been upgraded or repaired. Even, if the transceiver that is being repaired cannot be replaced immediately the rest of the radio is still operative and does not need to be sent to a repair facility or sit idle until the transceiver in question is returned. Additionally, each transceiver can be reprogrammed by the user through the network interface to support a different waveform.

Platform adapter 12, used to support the network/platform interface module 14, power amplifier 18 and transceivers 16, can either be extendable or of a fixed dimension. If the frame 12 is a fixed dimension it is possible to still expand the radio by connecting additional modules through a joint tactical radio connection 30. Platform adapter 12 is installed on a mount 20, which may be shock isolated. The mount 20 is existing or installed on various platforms, including but not limited to jeeps, tanks, humvees, aircraft, etc.

The unique packaging concept of radio 10 provides a low cost manufacturing alternative to the traditional single function "black box" approach. Radio 10 was carefully partitioned to allow the insertion of single transceivers 16 that provides a "black" interface to the radio platform (See FIG. 3). In an exemplary embodiment, the transceivers 16 are broadband (2–2000 MHz) transceivers that are scaled to meet the various channel requirements. By designing the transceiver modules with a "black" interface, the modules can be added, removed, or replaced in the field without regard to security classification requirements. All COMSEC related circuitry and associated NSA certification is confined to the network/platform interface module 14. In addition, power amplifier 18 configuration was developed to allow direct physical interchange between power amplifier 18 and the transceivers 16, resulting in a simple user-friendly design.

The design of radio 10 permits a generic, function independent very high speed digital interface to all of the line replaceable units or modules. This allows many different types of "functions" to be put in a module and inserted into the frame to form a system. The commercial concept of "Plug and Play" is inherent in this architecture across completely different modular functions. The single generic information pipe consists of a high speed serial data interface capable of in excess of 1000 mega bits per second simultaneously in both directions. This gives the interface the capability to transport data, control, configuration, status, initialization, digitized RF or even IP data packets. The architecture is sufficiently robust such that the function that is contained within the modules can be independent of the network interface 14. In the exemplary embodiment, the interconnect is serial and it consumes very few pins and facilitates routing from one module to another using simple digital switches.

The result of this architecture is that the requirement to support from 2 to 10 or more channels may be met simply be adding the appropriate number of low cost transceivers 16, power amplifiers 18, and network/platform interface modules 14. A radio 10 having ten transceiver modules 16 is illustrated in FIG. 2.

The radio 10 provides for scalability of channels allowing the radio to support from 1 to over 10 channels. The network interface module 14 allows for software reprogrammability and re-configurability without the requirement for additional hardware to accommodate added functionality. The platform interface module allows the radio 10 to be used in different airborne and ground environments. The common use of the network interface module 14 allows multiple independent levels of security for each communications channel. Further the independent housing of each module satisfies the requirement that radio 10 be operational in harsh ground and airborne environments including extreme temperature range, vibration, and immersibility.

An advantage of the exemplary embodiment in which each module includes separate housing is that cooling is a more manageable issue, since the circuitry of each module is not located in a common housing that needs to be cooled collectively. Further, the number of spare radio systems is eliminated in favor of spare modules which can be used to support a number of radio systems.

Radio 10 described herein adapts the concepts of modular communications and software reprogrammability to meet the demanding environment of the U.S. DoD ground, maritime, and aviation tactical battlefield environment. This invention provides a ruggedized, scalable, network centric, software radio architecture that is field repairable and upgradeable.

All modules have only "black" interfaces. This allows for functional partitioning. The TEMPEST boundaries are completely contained within the network module having INFOSEC capability. This keeps the "red" TEMPEST issues out of the design of all other module designs. As a result modular security capability is isolated, removable and completely isolated from the backplane. In addition this architecture uniquely allows the insertion of "black only" functions such as FAA certified air traffic control (ATC) waveforms. FAA waveforms require certification to DO-1788 which must be isolated from "non-certified" military radio software. This architecture also allows the implementation of a variety of security levels without changing hardware. Because of its modular hardware and software partitioning this architecture is able to implement System-high security or MILS by simply changing the software load in a field tactical environment.

To increase the cooling surface available the solid packaging concept used for Line Replaceable Units (LRU) in the past is replaced by a set of small LRUs or modules. Each module sit totally exposed to the ambient air in its own housing, thereby greatly increasing the power dissipation capability. Each module is designed to be mechanically robust and water immersible since there is not enclosing chassis to protect them. By packaging each radio channel or transceiver and power amplifier as separate modules or LRUs, not only is the dissipation of heat increase, but the thermal isolation from one LRU to another is increased. This allows increased flexibility for mixing and matching different sets of modules in the field without thermal interference from adjacent modules. EMI performance is improved because inter-channel RF interference is inherently much lower, due to the dramatically increased RF isolation between channels over an integrated approach. In addition, the use of LVDS as the serial interface that punctures the RF LRU boundary provides a much lower noise-power method of getting control/data into and out of each RF LRU.

Figure 3:
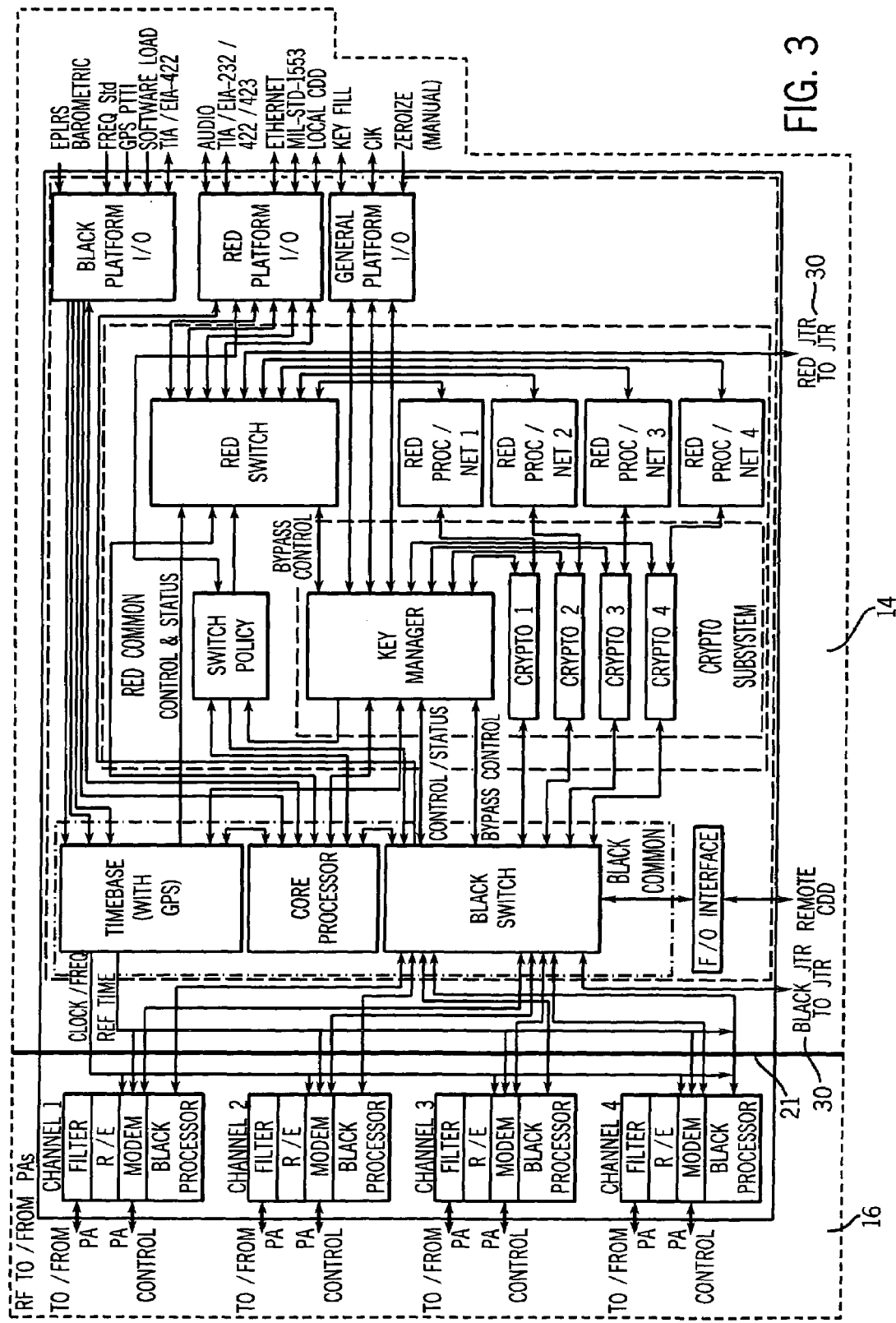
FIG. 3 is a functional block diagram view of a four channel modular radio.

The specific components and architecture for the network/platform interface and transceivers illustrated in FIG. 3 are described in U.S. patent application Ser. No. 10/229,877, entitled "SOFTWARE RADIO SYSTEM AND METHOD, and having inventor Robert R. Jakoubek, which is incorporated herein by reference.

When all of the features of the modular radio as discussed above are combined the result is a synergistic system that produces a reconfigurable, flexible, scalable, programmable radio system.

Further modifications may be made in the design, arrangement and combination of the elements without departing from the scope of the invention as expressed in the appended claims.

What is claimed is:

1. A modular communications platform having a chassis, comprising:
   a platform adapter;
   a network infosec unit module;
   a power amplifier module; and
   at least one transceiver module; and
   means for communication security encryption located in the network interface module only;
   wherein each of the network infosec unit module, power module and transceiver module includes an individual housing removably coupled to the chassis.

2. The modular communications platform of claim 1, wherein all circuitry requiring NSA clearance is located in the network infosec unit module only.

3. The modular communications platform of claim 2, wherein the network infosec unit module includes a programmable encryption device.

4. The modular communications platform of claim 3, further including a platform interface assembly.

5. The modular communications platform of claim 4, wherein the platform interface assembly attaches directly to the network interface assembly.

6. The modular communications platform of claim 4, wherein the network infosec unit module and transceiver module(s) communicate via a bus.

7. The modular communications platform of claim 6, wherein the network infosec unit module, transceiver module, and power amplifier module are connected to the bus with an easily removable mechanical connection.

8. The modular communications platform of claim 7, further including a plurality of identical transceiver modules, each transceiver supporting a channel defined by the network infosec unit module.

9. The modular communications platform of claim 8, wherein the individual housing of each of the network infosec unit module, power module, and transceiver modules includes a front portion and a first and second side portion, wherein the housings are arranged in a side-by-side relationship with one another.

10. The modular communications platform of claim 9, wherein each transceiver includes a filter and a modem.

11. A radio having frame, the radio comprising:
    a platform adapter supporting a bus;
    a network infosec unit module;
    a power amplifier module; and
    at least two transceiver modules;
    wherein each of the transceiver modules and power amplifier module may be located at any position on the frame and reconfigured to be located at any other position on the frame.

12. The radio of claim 11, further including a platform interface assembly removably connected to the network infosec assembly.

13. The radio of claim 12, wherein each module is removably secured to the platform adapter.

14. The radio of claim 13, wherein the network infosec unit module includes a programmable encryption device.

15. The radio of claim 14, wherein the platform interface assembly attaches to a front face of the network interface assembly.

16. The radio of claim 15, wherein the network infosec unit module, transceiver module, and power amplifier module communicates via a bus.

17. The radio of claim 16, wherein the network infosec unit module, transceiver module, and power amplifier module is connected to the bus with a easily removable mechanical connection.

18. A modular radio comprising:
    a network interface module; at least two identical transceiver modules; and a power amplifier module; each module including a separate housing; and
    wherein each transceiver module can be programmed by the network interface module to support a particular channel.

19. The modular radio of claim 18 wherein each transceiver module can be reprogrammed by the network interface module to support a different channel.

20. The modular radio of claim 19, wherein each housing is substantially exposed to the ambient air and may be removably coupled to a bus at any position along the bus.

* * * * *